United States Patent
Lundby et al.

(10) Patent No.: US 6,356,528 B1
(45) Date of Patent: Mar. 12, 2002

(54) INTERLEAVER AND DEINTERLEAVER FOR USE IN A DIVERSITY TRANSMISSION COMMUNICATION SYSTEM

(75) Inventors: Stein S. Lundby; Keith Saints, both of San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/293,527

(22) Filed: Apr. 15, 1999

(51) Int. Cl.$^7$ ............................................... H04J 13/00
(52) U.S. Cl. ........................ 370/209; 370/441; 370/679; 375/201
(58) Field of Search ................................ 370/320, 334, 370/335, 342, 345, 441, 442, 479, 208, 209; 375/205, 206, 208, 200, 296, 298, 346, 347, 349, 201; 455/101, 132, 137, 133

(56) References Cited

U.S. PATENT DOCUMENTS

| | | |
|---|---|---|
| 4,901,307 A | 2/1990 | Gilhousen et al. |
| 5,101,501 A | 3/1992 | Gilhousen et al. ............. 455/33 |
| 5,103,459 A | 4/1992 | Gilhousen et al. |
| 5,109,390 A | 4/1992 | Gilhousen et al. |
| 5,280,472 A | 1/1994 | Gilhousen et al. |
| 5,392,299 A | 2/1995 | Rhines et al. ............... 371/37.5 |
| 5,416,801 A | 5/1995 | Chouly et al. ............... 375/260 |
| 5,490,165 A | 2/1996 | Blakeney, II et al. ....... 375/205 |
| 5,513,176 A | 4/1996 | Dean et al. |
| 5,533,011 A | 7/1996 | Dean et al. |
| 5,654,979 A | 8/1997 | Levin et al. ................. 375/206 |
| 5,682,376 A | 10/1997 | Hayashino et al. .......... 370/206 |
| 5,751,761 A | 5/1998 | Gilhousen ................... 375/200 |
| 5,764,687 A | 6/1998 | Easton ........................ 375/206 |
| 5,790,550 A | 8/1998 | Peeters et al. ............... 370/480 |
| 6,064,663 A | * 5/2000 | Honkasalo et al. ......... 370/335 |
| 6,128,330 A | * 10/2000 | Schilling |

FOREIGN PATENT DOCUMENTS

| | | |
|---|---|---|
| EP | 0674455 | 10/1994 |
| EP | 0682426 | 11/1995 |
| EP | 0744841 | 11/1996 |
| WO | 9616496 | 5/1996 |
| WO | 9832256 | 7/1998 |

OTHER PUBLICATIONS

Jung, et al. "Application of Turbo–Codes to a CDMA Mobile Radio System Using Joint Detection and Antenna Diversity" Proceedings of the Vehicular Technology Conference, IEEE 2:770–774 (Jun. 1994).

* cited by examiner

Primary Examiner—Huy D. Vu
(74) Attorney, Agent, or Firm—Philip Wadsworth; Kent D. Baker; Bryon Yafuso

(57) ABSTRACT

Apparatuses for a transmitter and a receiver which enhance the performance of a system utilizing interleaving and transmit diversity by reordering the sequence of symbols transmitted along the different transmission channels. This enhancement is accomplished by providing different shuffling functions in conjunction with the interleavers and deinterleavers used with different transmission channels, which decreases the probability of loss of sequential symbols when transmission channels or antennas become correlated.

73 Claims, 3 Drawing Sheets

INTERLEAVER AND DEINTERLEAVER FOR USE IN A DIVERSITY TRANSMISSION COMMUNICATION SYSTEM

BACKGROUND OF THE INVENTION

I. Field of the Invention

The current invention relates to wireless telecommunications. More particularly, the present invention relates to a novel and improved transmitter design for enhancing the reliability of communications in a wireless communications system.

II. Description of the Related Art

The use of code division multiple access (CDMA) modulation techniques is one of several techniques for facilitating communications in which a large number of system users are present. Other multiple access communication system techniques, such as time division multiple access (TDMA), frequency division multiple access (FDMA) and AM modulation schemes such as amplitude companded single sideband (ACSSB) are known in the art. However, the spread spectrum modulation technique of CDMA has significant advantages over these other modulation techniques for multiple access communication systems.

The use of CDMA techniques in a multiple access communication system is disclosed in U.S. Pat. No. 4,901,307, entitled "SPREAD SPECTRUM MULTIPLE ACCESS COMMUNICATION SYSTEM USING SATELLITE OR TERRESTRIAL REPEATERS", assigned to the assignee of the present invention and incorporated by reference herein. The use of CDMA techniques in a multiple access communication system is further disclosed in U.S. Pat. No. 5,103,459, entitled "SYSTEM AND METHOD FOR GENERATING SIGNAL WAVEFORMS IN A CDMA CELLULAR TELEPHONE SYSTEM", and in U.S. Pat. No. 5,751,761, entitled "SYSTEM AND METHOD FOR ORTHOGONAL SPREAD SPECTRUM SEQUENCE GENERATION IN VARIABLE DATA RATE SYSTEMS", both assigned to the assignee of the present invention and incorporated by reference herein. The use of CDMA searchers is disclosed in U.S. Pat. No. 5,764,687, entitled "MOBILE DEMODULATOR ARCHITECTURE FOR A SPREAD SPECTRUM MULTIPLE ACCESS COMMUNICATION SYSTEM", assigned to the assignee of the present invention and incorporated by reference herein. Code division multiple access communications systems have been standardized in the United States in Telecommunications Industry Association TIA/EIA/IS-95-A, entitled "MOBILE STATION-BASE STATION COMPATIBILITY STANDARD FOR DUAL-MODE WIDEBAND SPREAD SPECTRUM CELLULAR SYSTEM", hereafter referred to as IS-95 and incorporated by reference herein.

The CDMA waveform, by its inherent nature of being a wideband signal, offers a form of frequency diversity by spreading the signal energy over a wide bandwidth. Therefore, frequency selective fading affects only a small part of the CDMA signal bandwidth. Space or path diversity on the forward or reverse link is obtained by providing multiple signal paths through simultaneous links to or from a mobile user through two or more antennas, cell sectors or cell-sites. Furthermore, path diversity may be obtained by exploiting the multipath environment through spread spectrum processing by allowing a signal arriving with different propagation delays to be received and processed separately. Examples of the utilization of path diversity are illustrated in U.S. Pat. No. 5,101,501 entitled "SOFT HANDOFF IN A CDMA CELLULAR TELEPHONE SYSTEM", and U.S. Pat. No. 5,109,390 entitled "DIVERSITY RECEIVER IN A CDMA CELLULAR TELEPHONE SYSTEM", both assigned to the assignee of the present invention and incorporated by reference herein.

In the CDMA demodulator structure used in some IS-95 systems, the PN chip interval defines the minimum separation two paths must have in order to be combined. Before the distinct paths can be demodulated, the relative arrival times (or offsets) of the paths in the received signal must first be determined. The demodulator performs this function by "searching" through a sequence of offsets and measuring the energy received at each offset. If the energy associated with a potential offset exceeds a certain threshold, a demodulation element, or "finger" may be assigned to that offset. The signal present at that path offset can then be summed with the contributions of other fingers at their respective offsets.

A method and apparatus of finger assignment based on searcher and finger energy levels is disclosed in U.S. Pat. No. 5,490,165, entitled "FINGER ASSIGNMENT IN A SYSTEM CAPABLE OF RECEIVING MULTIPLE SIGNALS", assigned to the assignee of the present invention and incorporated by reference herein. In the exemplary embodiment, the CDMA signals are transmitted in accordance with IS-95. An exemplary embodiment of the circuitry capable of demodulating IS-95 forward link signals is described in detail in U.S. Pat. No. 5,764,687, entitled "MOBILE DEMODULATOR ARCHITECTURE FOR A SPREAD SPECTRUM MULTIPLE ACCESS SYSTEM", assigned to the assignee of the present invention and incorporated by reference herein. An exemplary embodiment of the circuitry capable of demodulating IS-95 reverse link signals is described in detail in U.S. Pat. No. 5,654,979, entitled "CELL SITE DEMODULATOR ARCHITECTURE FOR A SPREAD SPECTRUM MULTIPLE ACCESS COMMUNICATION SYSTEM," assigned to the assignee of the present invention and incorporated by reference herein.

In the exemplary embodiment, the signals are complex PN spread as described in U.S. patent application Ser. No. 08/856,428, entitled "REDUCED PEAK TO AVERAGE TRANSMIT POWER HIGH DATA RATE IN A CDMA WIRELESS COMMUNICATION SYSTEM," filed Apr. 9, 1996, assigned to the assignee of the present invention and incorporated by reference herein, and in accordance with the following equations:

$$I = I'PN_I + Q'PN_Q \tag{4}$$

$$Q = I'PN_Q - Q'PN_I. \tag{5}$$

where $PN_I$ and $PN_Q$ are distinct PN spreading codes and I' and Q' are two channels being spread at the transmitter.

The International Telecommunications Union recently requested the submission of proposed methods for providing high rate data and high-quality speech services over wireless communication channels. A first of these proposals was issued by the Telecommunications Industry Association, entitled "The cdma2000 ITU-R RTT Candidate Submission". A second of these proposals was issued by the European Telecommunications Standards Institute (ETSI), entitled "The ETSI UMTS Terrestrial Radio Access (UTRA) ITU-R RTT Candidate Submission". And a third proposal was submitted by U.S. TG 8/1 entitled "The UWC-136 Candidate Submission" (referred to herein as EDGE). The contents of these submissions is public record and is well known in the art.

In addition to the aforementioned properties, CDMA's broadband nature permits the demodulation of signals having traversed different propagation paths. In U.S. Pat. Nos. 5,280,472, 5,513,176, 5,553,011, assigned to the assignee of the present invention and incorporated by reference herein, the usage of multiple sets of distributed antennas is employed to deliberately provide multiple paths of propagation. In the just mentioned U.S. Patents, sets of antennas are fed by a common signal with only time delay processing to distinguish signals. The transmit output of the base station is fed to a string of antenna elements for example with a coaxial cable. The antenna elements connect to the cable using power splitters. The resulting signals, amplified and frequency converted as necessary, are fed to the antennas. The salient features of this distributed antenna concept are as follows: (1) simple and inexpensive dual antenna node design; (2) neighboring antennas have time delays inserted in feed structure so signals received and transmitted from neighboring antennas are distinguishable by PN temporal processing; (3) exploitation of direct sequence CDMA's ability to discriminate against multipath; and (4) creation of deliberate multipath that satisfies discrimination criteria.

Antenna transmit diversity as well as multi-carrier transmission are promising new technologies that improve transmission resistance to fading by offering space and/or frequency diversity. In the antenna transmit diversity case for example, the data to be transmitted is encoded into symbols, which are then distributed among the antennas and transmitted.

Many techniques have been proposed for mitigating mutual interference between signals transmitted from the different antennas. Such techniques include delay transmit diversity, orthogonal transmit diversity (OTD), time switched transmit diversity (TSTD), time delayed transmit diversity (TDTD), and multi-carrier transmit diversity (MCTD). Each of these methods shares with the others a common goal of providing additional diversity in the transmitted signal through space, time, frequency or code space. These methods are known in the art and have been described in proposals to the International Telecommunications Union in response to their request for proposed Third Generation Wireless communication systems. Methods for introducing diversity into a transmitted signal are almost limitless by their very nature. Copending U.S. Pat. No. 6,215,777 entitled "Method and Apparatus for Transmitting and Receiving Data Multiplexed onto Multiple Code Channels, Frequencies and Base Stations", filed Sep. 15, 1997, assigned to the assignee of the present invention and incorporated by reference herein, describes a matrix of methods for transmitting CDMA signals using multiple carriers and multiple code channels for introducing diversity into the transmitted signal.

In addition, the multi-carrier transmission, whether it uses antenna transmit diversity or not, must distribute the coded symbols among the different carriers, which is similar to distributing symbols among several antennas in an antenna transmit diversity system. One skilled in the art will appreciate that, in the case where a multi-carrier system uses a single transmit antenna, the channels utilizing the two carriers may still be thought of as independent transmission channels which may or may not suffer from correlated fading. Correlated fading is the phenomenon whereby each of the transmissions suffers degradation in a temporally correlated fashion.

In a system utilizing interleaving in conjunction with transmit diversity, it is desirable to fully utilize the gain offered by both techniques, as well as to make sure that the interleaver also performs well when the transmission channels become correlated. For example, in a system utilizing two transmission channels, using either two transmit antennas or two carriers, correlated fading in both transmission channels may cause the loss of adjacent transmitted coded symbols. Decoders such as trellis decoders and turbo decoders are often more susceptible to the loss of several successive symbols than to the loss of the same number of symbols spread throughout the data stream. In order to reduce the probability of loss of adjacent encoded symbols, interleavers such as block interleavers and turbo coded interleavers are employed. However, these traditional interleaving methods provide less time diversity when employed by traditional means in systems employing transmission diversity. Thus, there is a need felt in the art for a method of decreasing the chances of losing successive symbols in a system which utilizes transmit diversity.

SUMMARY OF THE INVENTION

The current invention enhances the performance of a system utilizing interleaving and transmit diversity by reordering the sequence of symbols transmitted along the different transmission channels. For example, in the case of a system using two transmission channels, the symbols being transmitted on one channel are shuffled with respect to the symbols transmitted through the other channel. This shuffling makes it less likely that successive symbols output by the interleaver are lost to correlated fading in the two transmission channels.

Suppose a source frame F is composed of N coded symbols Si ($1<i<N$). Suppose also that these symbols Si are distributed over M transmitters (different carriers or antennas or both). The current invention splits the symbols into M groups Gj ($1<j<M$), one for each transmitter. Then each of the groups, Gj, is interleaved independently.

A problem which can occur if the interleavers and splitter are not chosen correctly, or even worse if they are all identical, is that the performance will be severely degraded when the signals from the different transmitters go through channels that are correlated.

Consider the case where there are 2 transmitters that lead to 2 antennas to provide space diversity in a transmitted signal. If the symbols are allocated for transmission such that odd symbols are provided for transmission through the first antenna and the even symbols are provided for transmission through the second antenna and wherein the symbols are interleaved subsequent to their provision to the respective antennas. If traditional interleaving strategies are used, correlated fading will severely deteriorate performance.

The goal of the shuffle is to make sure that even if the different transmission paths from the different transmitters become correlated, the performance degradation is minor. One particularly efficient implementation of the shuffle that each shuffle cyclically rotates the symbols it receives. Here is an example:

Shuffler j: cyclically rotate the symbols to be transmitted by transmitter j by $(j-1)*N/M$ symbols. Thus, if N=4, M=2 and G2 after interleaving is "abcd", then shuffler 2 would output "cdab", which is "abcd" that has been cyclically rotated by N/M=2 symbols. An alternative embodiment of a shuffler is a flip. This transforms "abcd" into "dcba".

It will be understood by one skilled in the art that the shuffle operations, though presented as being subsequent to and separate from the traditional interleaving operation, in reality would probably be combined with interleaving, yielding a single operation in a real implementation.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF PREFERRED EMBODIMENTS

Figure 1:
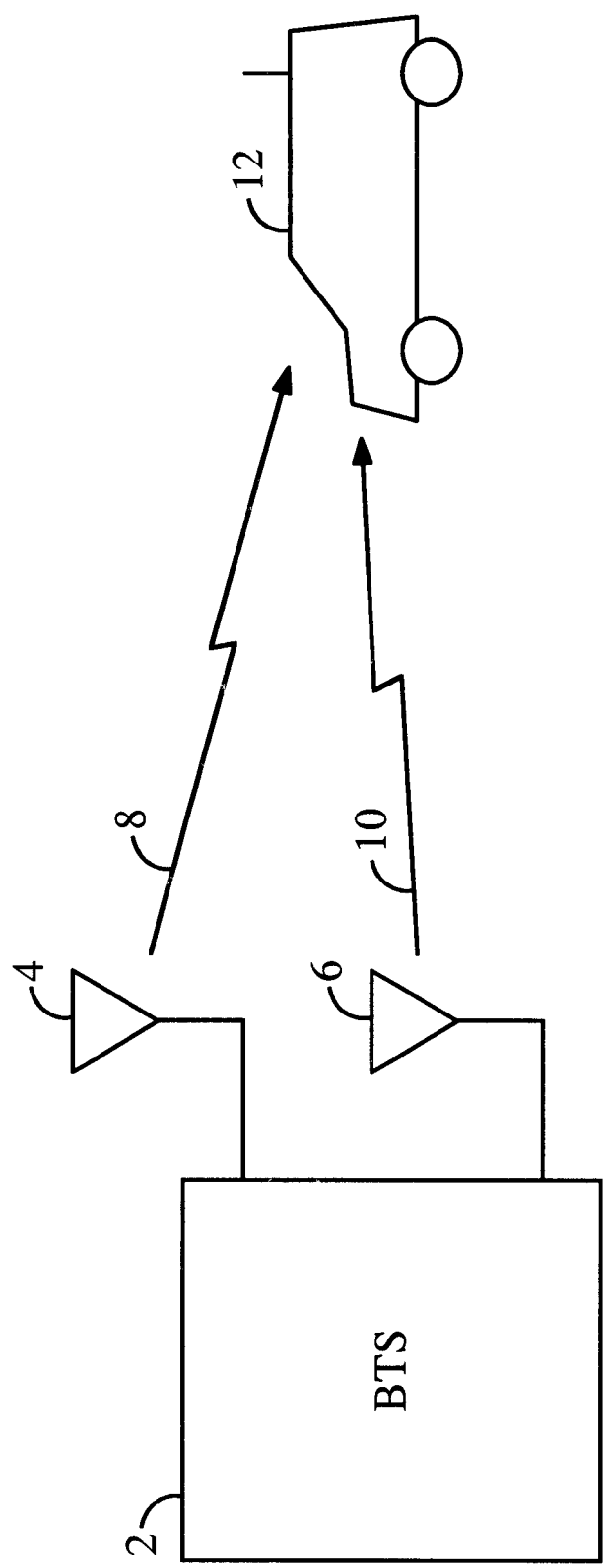
FIG. 1 is a diagram illustrating basic components of a wireless communication system incorporating an embodiment of the invention.

FIG. 1 shows the present invention in the context of a wireless communication system. The base station transceiver subsystem (BTS) 2 includes two transmit antennas 4 and 6, which are used to transmit signals along two transmission channels 8 and 10 to a subscriber station 12. The present invention is applicable to any communication system employing diversity transmission. In the exemplary embodiment, the signals transmitted from base station transceiver subsystem (BTS) 2 are code division multiple access communication signals. One skilled in the art will appreciate that the BTS could be replaced by a wireless local loop concentrated subscriber station (CSS) or any other transmitter employing diversity transmission without departing from the embodied invention. The generation and transmission of code division multiple access communication signals is well known in the art and is described in detail in the aforementioned U.S. Pat. No. 5,103,459 and in the IS-95 specification. The present invention is also applicable to frequency division multiple access (FDMA) communication systems and to time division multiple access (TDMA) communication systems, such the GSM communication system and the proposed third generation TDMA communication system commonly referred to as EDGE.

The transmit antennas 4 and 6, could be separated spatially to provide transmit diversity by either placing them in different physical locations, or by using directional antennas pointed in different directions from each other. In an alternate embodiment using multicarrier transmit diversity, a single antenna could be used as the source of the two signals.

The subscriber station 12 is shown as a car, but could also be a wireless modem, wireless local loop subscriber station, or any other portable wireless communication subscriber equipment. The method and apparatus for simultaneously receiving multiple transmissions is well known in the art. In the exemplary embodiment, the signals transmitted from antennas 4 and 6 are received at subscriber station 12 using a RAKE receiver, the implementation of which is well known in the art and is described in the aforementioned U.S. Pat. No. 5,109,390.

Figure 2:
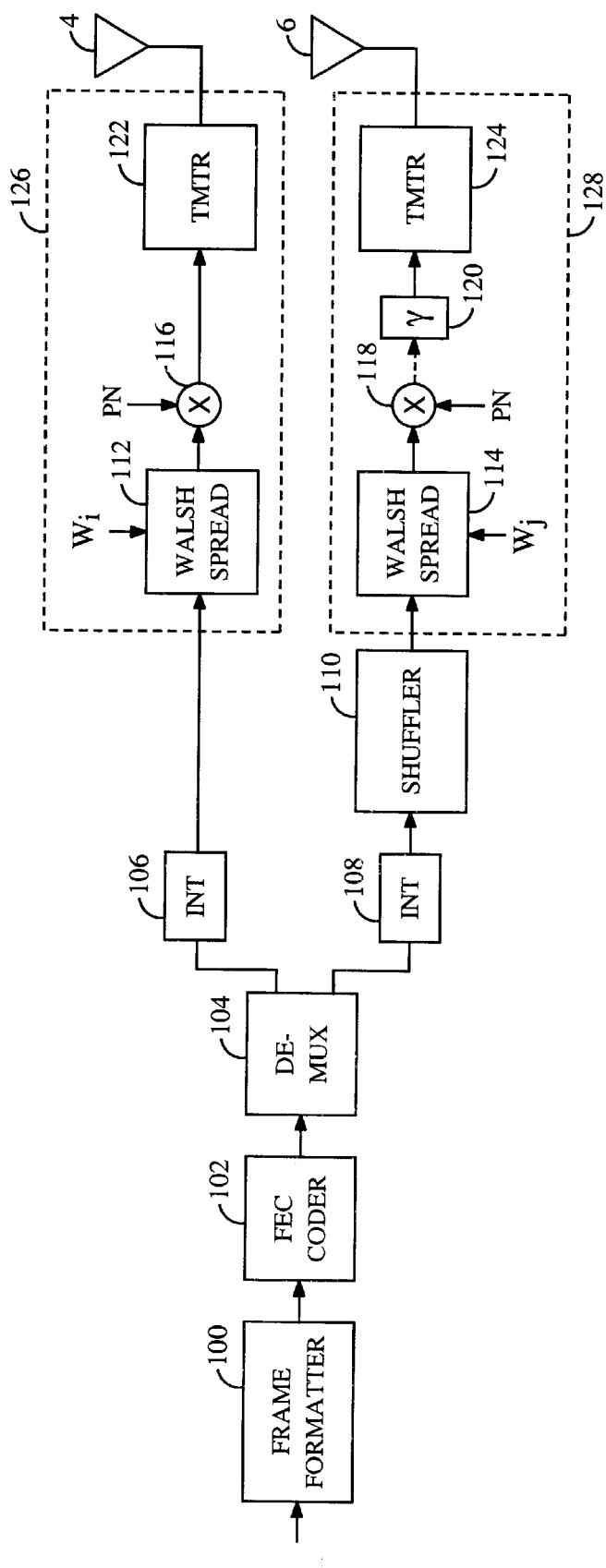
FIG. 2 is a block diagram of a preferred embodiment of the invention in a wireless base station.

FIG. 2 shows a preferred embodiment of the invention as used in a wireless base station (BTS). Data to be transmitted to the subscriber station is input first to a frame formatter 100. The data which is encapsulated in the frame formatter may be voice data, fax, packet data, or any other data capable of being represented by a digital bit stream.

The frame formatter 100 is operationally coupled with a forward error correction (FEC) module 102, which adds forward error correction codes to the data stream. The FEC module 102 may use any of several forward error correction techniques, including turbo-coding, convolutional coding, or other form of soft decision or block coding.

After FEC coding, the data is processed by a demultiplexor, or demux 104, which is operationally connected to the FEC module 102. Demux 104 distributes the error correction coded symbols into different groups, each of which is processed separately until transmission. Though FIG. 2 depicts the use of two groups, one skilled in the art will appreciate that demux 104 may distribute symbols into more than two groups without departing from the embodied invention. In the exemplary embodiment, the method of demultiplexing the single symbol stream into two symbol streams includes simple alternation, in which all odd symbols are distributed into one, and all even symbols are distributed into the other.

Each group of bits is then processed by an interleaver 106 and 108, operably connected to the demux 104. Each interleaver may utilize any of a number of interleaving techniques, such as block interleaving and bit reversal interleaving. The output of one interleaver 106 is sent to a transmit subsystem 126, shown in the exemplary embodiment as including a Walsh spreader 112, a PN spreader 116, and a transmitter 122. The output of interleaver 106 is sent to the Walsh spreader 112, which is operably connected to the interleaver 106.

CDMA systems that include an orthogonal spreading followed by a PN spreading are described in detail in the aforementioned U.S. Pat. No. 5,109,459. It will be understood that, although described in the context of traditional Walsh codes, the present invention is applicable to other orthogonal channelization methods such as orthogonal variable length spreading functions of the proposed WCDMA standard and described in detail the aforementioned U.S. Pat. No. 5,751,761. In the exemplary embodiment, the PN spreading can be performed using either a traditional quadrature PN spreading such as standardized in the IS-95 standard or using a complex PN spreading such as described in the proposed cdma2000 and WCDMA Third Generation standards and described in detail in the aforementioned copending U.S. patent application Ser. No. 08/856,428.

In a CDMA system using orthogonal Walsh coding, the channels that are distinguished from each other by utilizing these Walsh codes are referred to as Walsh channels. One skilled in the art will appreciate that a system could include transmission subsystems using an alternate form of signal separation technique, such as FDMA or TDMA, without departing from the embodied invention.

As shown, the unshuffled output of the first interleaver 106 is processed in a manner typical of many current CDMA systems. The signal proceeds to a Walsh spreader 112, which is operably connected to the interleaver 106, and then to a PN spreader 116, which is operably connected to the Walsh spreader 112. The Walsh spreader 112 serves to multiply each data bit coming from the interleaver 106 by a Walsh code $W_i$, while the PN spreader provides superior autocorrelation properties that allows for the demodulation of multipath signals. The PN spread signal from PN spreader 116 is provided to transmitter 122 which amplifies, upconverts and filters the signal from transmission though antenna 4 on transmission channel 8.

The output of the second interleaver 108 is sent to a shuffler 110, operationally connected to the interleaver 108, which resequences the data output by the interleaver 108. The output of the shuffler 110 is then sent to a second transmission subsystem 128, again shown in an exemplary embodiment as including a Walsh spreader 114, a PN spreader 118, and a transmitter 124. The output of the shuffler 110 is sent to the Walsh spreader 114, which is operably connected to the shuffler 110. The Walsh spreader 114 serves to multiply each data bit coming from the shuffler 110 by a Walsh code $W_j$.

In a preferred embodiment of the invention, the shuffler 110 operates by cyclically rotating each group of four sequential symbols abcd into a different sequence of bits cdab. Other shuffling functions, such as reversing or flipping, may be used without departing from the embodied invention. One skilled in the art will appreciate that additional shuffling functions may be utilized for each symbol group, in a system having more than two such groups. The goal of the shuffling process is to reduce the effects of correlated fading on transmission channels 8 and 10. By employing shuffler 110, a fade simultaneously effecting transmission channels 8 and 10 will not erase consecutive symbols in the frame of symbols. As is well known in the art, forward error correction decoders such as trellis decoders and turbo decoders are much more effective in correcting errors that not consecutive than they are at correcting those that are.

The output of the shuffler 110 is processed in much the same way as the unshuffled signal from the first interleaver 106. The shuffled signal proceeds from the shuffler 110 to a Walsh spreader 114, and then to a PN spreader 118.

In an alternative embodiment of the invention using multiple carriers to accomplish transmit diversity, both transmission subsystems 126 and 128 may share a single transmit antenna.

The exemplary embodiment envisions three alternative methods of separation of the signals transmitted from antennas 4 and 6. In the first embodiment, the signals transmitted from antennas 4 and 6 are transmitted on the same frequency and the separation of the signals is provided by spreading the signals prior to transmission using different Walsh functions. In the second exemplary embodiment, the signals transmitted from antennas 4 and 6 are transmitted on different carrier frequencies in which case the Walsh spreading operations performed by Walsh spreaders 112 and 114 may be either the same or different. In an alternative embodiment, the signals are distinguished from one another by introducing a delay prior to transmission using delay element 120. Methods of time transmit diversity are described in detail in aforementioned U.S. Pat. Nos. 5,280,472, 5,513,176 and 5,533,011. In this alternative embodiment, the signals transmitted from antennas 4 and 6 are on the same frequency and may or may not be spread using the same Walsh spreading function in Walsh Spreaders 112 and 114.

Figure 3:
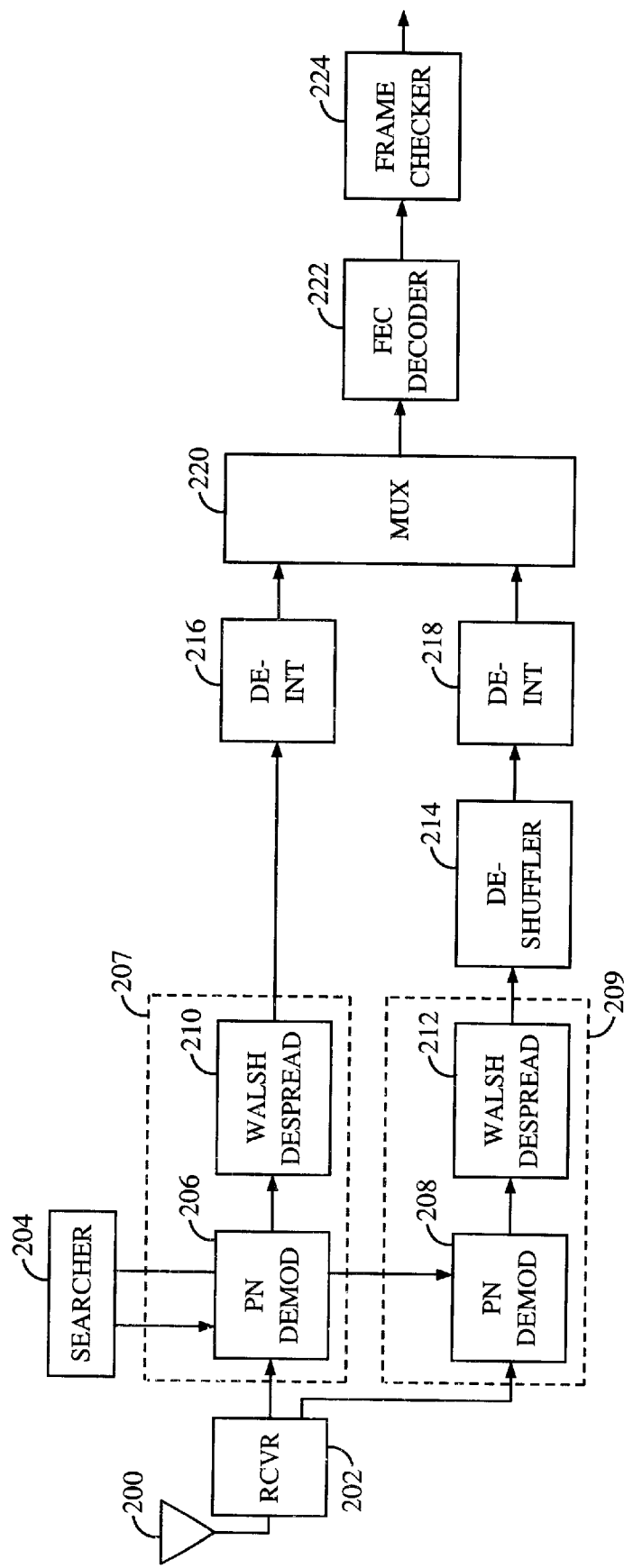
FIG. 3 is a block diagram of a preferred embodiment of the invention in a wireless subscriber station.

FIG. 3 shows a preferred embodiment of the invention as used in a CDMA wireless subscriber station. The signal is received through antenna 200 and processed by receiver 202. The resultant signals are then processed by multiple demodulation subsystems 207 and 209. Demodulation subsystem 207 demodulates the signal that has traversed transmission channel 8. Deinterleaver 216 receives the demodulated signal output by the demodulation subsystem 207 and de-interleaves the signal.

If the signal that has traversed transmission channel 8 is transmitted on the same frequency as the signal transmitted on transmission channel 10, then receiver 202 amplifies, down converts and filters the signal using the same hardware. However, if the signals that traversed transmission channels 8 and 10 have been transmitted on different carrier frequencies, then the received signal will be downconverted using different mixing frequencies and the resultant signals from the different mixing operation will be provided to demodulation subsystem 207 and 209.

Demodulation subsystem 209 demodulates the signal that has traversed transmission channel 10. Within demodulator 207, PN demodulator 206 demodulates the received signal in accordance with a PN offset that is determined in accordance with a signal from searcher 204. The implementation of CDMA searchers is well known in the art, an exemplary embodiment of which is described in detail in aforementioned U.S. Pat. No. 5,764,687.

The PN despread signal is provided to Walsh despreader, which removes the Walsh covering from the PN despread signal. The signal produced by the demodulator subsystem 207 is provided to de-interleaver 216, which deinterleaves the uncovered signal so as to undo the interleaving operation performed by interleaver 106.

The signal which traversed transmission channel 10 is demodulated in demodulation subsystem 209, within which the received signal is processed using a PN demodulator 208, and then despread using a Walsh despreader 212. The output of the demodulation subsystem 209 is then processed by an operably connected deshuffler 214. The deshuffler 214 performs the inverse function of the shuffler 110. The deshuffled output of the deshuffler 214 is then sent to an operably connected deinterleaver 218. The deinterleaver 218 performs the inverse function of the interleaver 108.

The output of the interleavers 216 and 218 are connected to a multiplexor or MUX 220, which performs the reverse operation of the demux 104 to form a single data stream. The resulting single data stream is then processed by a FEC decoder 222, which performs error correction according to the forward error correction code utilized by the FEC coder 102. As with the FEC coder, the FEC decoder may use any of several forward error correction techniques, including turbo-coding, convolutional coding, or other form of soft decision or block coding.

The data output by the FEC decoder 222 is then processed by a frame checker 224, which verifies the validity of the received frames, usually using a CRC.

What is claimed is:

1. An apparatus for transmitting an information signal, comprising:

first interleaver means for receiving a first portion of said information signal and for reordering the symbols of said first portion of said information signal in accordance with a first interleaving format to provide a first interleaved signal;

first transmission subsystem for receiving said first interleaved signal and for transmitting said first interleaved signal on a first transmission channel;

second interleaver means for receiving a second portion of said information signal and reordering the symbols of said second portion of said information signal in accordance with a second interleaving format to provide a second interleaved signal;

second transmission subsystem for receiving said second interleaved signal and for transmitting said second interleaved signal on a second transmission channel; and shuffler for receiving said second interleaved signal and shuffling the symbols from said second interleaved signal before transmission through said second transmission subsystem.

2. The apparatus of claim 1 further comprising a demultiplexor for receiving said information signal and dividing said information signal into said first portion and said second portion, and providing said first portion to said first interleaver and providing said second portion to said second interleaver.

3. The apparatus of claim 2 wherein said demultiplexor divides up said information signal by placing each odd symbol into said first portion and placing each even symbol into said second portion.

4. The apparatus of claim 2 further comprising a forward error correction module for receiving a set of bits and for encoding in accordance with a predetermined forward error correction format to provide said information signal.

5. The apparatus of claim 4 wherein said forward error correction format is a convolutional encoding format.

6. The apparatus of claim 4 wherein said forward error correction format is a turbo coding format.

7. The apparatus of claim 1 wherein said first interleaving format and said second interleaving format are block interleaving formats.

8. The apparatus of claim 1 wherein said first interleaving format and said second interleaving format are bit reversal interleaving.

9. The apparatus of claim 1 wherein said first interleaving format is a block interleaving format and said second interleaving format is a bit reversal interleaving format.

10. The apparatus of claim 1 wherein said first interleaving format and said second interleaving format are the same.

11. An apparatus for transmitting an information signal, comprising:

first interleaver means for receiving a first portion of said information signal and for reordering the symbols of said first portion of said information signal in accordance with a first interleaving format to provide a first interleaved signal;

first transmission subsystem for receiving said first interleaved signal and for transmitting said first interleaved signal on a first transmission channel;

second interleaver means for receiving a second portion of said information signal and reordering the symbols of said second portion of said information signal in accordance with a second interleaving format to provide a second interleaved signal, wherein said second interleaver means comprises: a interleaver subsystem for reordering symbols in accordance with a predetermined interleaver format to provide a pre-shuffled signal and a shuffler for receiving said pre-shuffled signal and shuffling the symbols from said pre-shuffled to produce said second interleaved signal; and second transmission subsystem for receiving said second interleaved signal and for transmitting said second interleaved signal on a second transmission channel.

12. The apparatus of claim 1 wherein said shuffler performs shuffling by cyclically rotating sets of a predetermined number of symbols.

13. The apparatus of claim 12 wherein said predetermined number is four.

14. The apparatus of claim 13 wherein said shuffler rotates said sets of four symbols by two symbols.

15. The apparatus of claim 1 wherein said shuffler performs shuffling by flipping sets of a predetermined number of symbols.

16. The apparatus of claim 15 wherein said predetermined number is four.

17. The apparatus of claim 1 wherein said first transmission subsystem transmits said first interleaved signal on a first transmission channel by spreading said first interleaved signal in accordance with a first Walsh function to produce a first Walsh coded signal; and wherein said second transmission subsystem transmits said second interleaved signal on a second transmission channel by spreading said second interleaved signal in accordance with a second Walsh function to produce a second Walsh coded signal.

18. The apparatus of claim 17 wherein said first Walsh function is the same as said second Walsh function.

19. The apparatus of claim 17 wherein said first Walsh function is orthogonal to said second Walsh function.

20. The apparatus of claim 19 wherein said first transmission subsystem and said second transmission subsystem are synchronized in time and phase.

21. The apparatus of claim 17 wherein said first transmission subsystem further comprises a first PN spreader for receiving said first Walsh coded signal and spreading said first Walsh coded signal in accordance with a first pseudonoise (PN) function to provide a first PN spread signal, and said second transmission subsystem further comprises a second PN spreader for receiving said second Walsh coded signal and spreading said second Walsh coded signal in accordance with a second pseudonoise (PN) function to provide a second PN spread signal.

22. The apparatus of claim 21 wherein said first PN spreader and said second PN spreader utilize quadrature PN spreading.

23. The apparatus of claim 21 wherein said first PN spreader and said second PN spreader utilize complex PN spreading.

24. The apparatus of claim 21 wherein said second transmission subsystem further comprises a delay element for receiving said second PN spread signal and producing a delayed PN spread signal.

25. The apparatus of claim 24 wherein said first transmission subsystem further comprises a first transmitter for upconverting to a first frequency and amplifying said first PN spread signal and producing a first transmission signal, and said second transmission subsystem further comprises a second transmitter for upconverting to a second frequency and amplifying said delayed PN spread signal and producing a second transmission signal.

26. The apparatus of claim 25 wherein said first transmitter transmits said first transmission signal through an antenna and said second transmitter said second transmission signal through said antenna.

27. The apparatus of claim 25 wherein said first transmitter transmits said first transmission signal through a first antenna and said second transmitter said second transmission signal through a second antenna.

28. The apparatus of claim 27 wherein said first frequency is equal to said second frequency.

29. The apparatus of claim 27 wherein said first frequency is greater than said second frequency.

30. The apparatus of claim 21 wherein said first transmission subsystem further comprises a first transmitter for upconverting to a first frequency and amplify said first PN spread signal and producing a first transmission signal; and said second transmission subsystem further comprises a second transmitter for upconverting to a second frequency and amplifying said second PN spread signal and producing a second transmission signal.

31. The apparatus of claim 30 wherein said first transmitter transmits said first transmission signal through a first antenna and said second transmitter said second transmission signal through a second antenna.

32. The apparatus of claim 31 wherein said first frequency is equal to said second frequency.

33. The apparatus of claim 31 wherein said first frequency is greater than said second frequency.

34. The apparatus of claim 30 wherein said first transmitter transmits said first transmission signal through an antenna and said second transmitter said second transmission signal through said antenna.

35. The apparatus of claim 11 wherein said shuffler performs shuffling by cyclically rotating sets of a predetermined number of symbols.

36. The apparatus of claim 35 wherein said predetermined number is four.

37. The apparatus of claim 36 said shuffler rotates said sets of four symbols by two symbols.

38. The apparatus of claim 11 wherein said shuffler performs shuffling by flipping sets of a predetermined number of symbols.

39. The apparatus of claim 38 wherein said predetermined number is four.

40. An apparatus for receiving an information signal, comprising:

first demodulation subsystem for receiving a first portion of a received signal, demodulating said first portion to create a first demodulated signal;

first deinterleaver for deinterleaving said first demodulated signal according to a first deinterleaving format to produce a first deinterleaved signal;

second demodulation subsystem for receiving a second portion of a received signal, demodulating said second portion to create a second demodulated signal;

second deinterleaver for deinterleaving said second demodulated signal according to a second deinterleaving format to produce a second deinterleaved signal; and deshuffler, operably connected between said second demodulation subsystem and said second deinterleaver, for receiving said second demodulated signal and unshuffling said second demodulated signal to produce an unshuffled signal used by said second deinterleaver.

41. The apparatus of claim 40 further comprising a multiplexor for receiving said first deinterleaved signal land said second deinterleaved signal and combining them to create a multiplexed signal.

42. The apparatus of claim 41 wherein said multiplexor produces the stream of symbols contained in said multiplexed signal by alternating symbols received in said first deinterleaved signal and said second deinterleaved signal, wherein all odd symbols of said demultiplexed signal are extracted from said first deinterleaved signal, and all even symbols are extracted from said second deinterleaved signal.

43. The apparatus of claim 41 further comprising a forward error correction decoder for receiving said demultiplexed signal and decoding said demultiplexed signal in accordance with a predetermined forward error correction format to extract an information signal from said demultiplexed signal.

44. The apparatus of claim 43 wherein said forward error correction decoder is a turbo decoder.

45. The apparatus of claim 43 wherein said forward error correction decoder is a trellis decoder.

46. The apparatus of claim 43 wherein said forward error correction decoder is a soft decision decoder.

47. The apparatus of claim 43 wherein said forward error correction decoder is block decoder.

48. The apparatus of claim 41 wherein said first deinterleaver and said second deinterleaver are block deinterleavers.

49. The apparatus of claim 41 wherein said first deinterleaver and said second deinterleaver are bit reversal deinterleavers.

50. The apparatus of claim 41 wherein said first deinterleaver is a block deinterleaver and said second deinterleaver is a bit reversal deinterleaver.

51. The apparatus of claim 41 wherein said first deinterleaving format is the same as said second deinterleaving format.

52. An apparatus for receiving an information signal, comprising:

first demodulation subsystem for receiving a first portion of a received signal, demodulating said first portion to create a first demodulated signal;

first deinterleaver for deinterleaving said first demodulated signal according to a first deinterleaving format to produce a first deinterleaved signal;

second demodulation subsystem for receiving a second portion of a received signal, demodulating said second portion to create a second demodulated signal; and second deinterleaver for deinterleaving said second demodulated signal according to a second deinterleaving format to produce a second deinterleaved signal, wherein said second deinterleaver further comprises a deshuffler for unshuffling said second demodulated signal prior to performing said deinterleaving.

53. The apparatus of claim 40 wherein said deshuffler performs deshuffling by cyclically rotating sets of a predetermined number of symbols.

54. The apparatus of claim 53 wherein said predetermined number is four.

55. The apparatus of claim 54 wherein said deshuffler rotates said sets of four symbols by two symbols.

56. The apparatus of claim 40 wherein said deshuffler performs deshuffling by flipping sets of a predetermined number of symbols.

57. The apparatus of claim 56 wherein said predetermined number is four.

58. The apparatus of claim 40 wherein said first demodulation subsystem further comprises a first PN despreader for receiving said first portion of said received signal and despreading said first portion of said received signal in accordance with a first pseudonoise (PN) sequence to produce a first PN despread signal; and wherein said second demodulation subsystem further comprises a second PN despreader for receiving said second portion of said received signal and despreading said second portion of said received signal in accordance with a second PN sequence to produce a second PN despread signal.

59. The apparatus of claim 58 wherein said first PN despreader and said second PN despreader are quadrature PN despreaders.

60. The apparatus of claim 58 wherein said first PN despreader and said second PN despreader are complex PN, despreaders.

61. The apparatus of claim 58 further comprising a searcher for providing time offsets used for PN despreading by said PN despreaders.

62. The apparatus of claim 58 wherein said first demodulation subsystem further comprises a first Walsh despreader for receiving said first PN despread signal and despreading said first PN despread signal in accordance with a first Walsh function to produce a first Walsh decoded signal; and wherein said second transmission subsystem further comprises a second Walsh despreader for receiving said second PN despread signal and despreading said second PN despread signal in accordance with a second Walsh function to produce a second Walsh decoded signal.

63. The apparatus of claim 62 wherein said first Walsh function and said second Walsh function are the same as each other.

64. The apparatus of claim 62 wherein said first Walsh function is orthogonal to second Walsh function.

65. The apparatus of claim 40 wherein said first demodulation subsystem further comprises a first receiver subsystem for amplifying and downconverting from a first frequency a received signal to produce said first portion of a received signal, and wherein said second demodulation subsystem further comprises a second receiver subsystem for amplifying and downconverting from a second frequency said received signal to produce said second portion of a received signal.

66. The apparatus of claim 65 wherein said first frequency is equal to said second frequency.

67. The apparatus of claim 66 wherein said first demodulation subsystem and said second demodulation subsystem share a single receiver subsystem.

68. The apparatus of claim 65 wherein said first frequency is greater than said second frequency.

69. The apparatus of claim 52 wherein said deshuffler performs deshuffling by cyclically rotating sets of a predetermined number of symbols.

70. The apparatus of claim 69 wherein said predetermined number is four.

71. The apparatus of claim 70 wherein said deshuffler rotates said sets of four symbols by two symbols.

72. The apparatus of claim 52 wherein said deshuffler performs deshuffling by flipping sets of a predetermined number of symbols.

73. The apparatus of claim 72 wherein said predetermined number is four.

* * * * *